United States Patent
Taguchi et al.

[11] Patent Number: 5,879,819
[45] Date of Patent: Mar. 9, 1999

[54] SLIDING PARTS AND PROCESS FOR PRODUCING SAME

[75] Inventors: Chobee Taguchi, Suita; Akihiro Yukawa, Osaka; Hironori Matsumoto, Osaka; Nobukazu Ikeda, Osaka; Akihiro Morimoto, Osaka, all of Japan

[73] Assignees: Japan Scientific Engineering Co., Ltd.; Fujikin Incorporated, both of Osaka, Japan

[21] Appl. No.: 840,467

[22] Filed: Apr. 18, 1997

[30] Foreign Application Priority Data

Apr. 22, 1996 [JP] Japan ................................. 8-099874

[51] Int. Cl.⁶ .............................. B32B 15/18; C22F 1/14
[52] U.S. Cl. ........................... 428/673; 428/685; 148/518; 148/530; 148/537; 411/902; 285/422
[58] Field of Search ...................... 428/673, 685; 148/518, 530, 537; 384/912; 411/902; 420/501; 285/422

[56] References Cited

U.S. PATENT DOCUMENTS

| | | | |
|---|---|---|---|
| 3,634,048 | 1/1972 | Koons et al. | 29/196.6 |
| 3,914,161 | 10/1975 | Yonezawa et al. | 204/44 |
| 4,053,728 | 10/1977 | Talento et al. | 200/267 |
| 5,520,492 | 5/1996 | Ohmi et al. | 411/427 |
| 5,684,847 | 11/1997 | DeFoort et al. | 376/339 |

*Primary Examiner*—John J. Zimmerman
*Attorney, Agent, or Firm*—Armstrong, Westerman, Hattori, McLeland & Naughton

[57] ABSTRACT

A sliding part has a film of an Ag-In alloy comprising 25 to 35 wt. % of In and the balance Ag and inevitable impurities and formed on a surface of a stainless steel main body thereof which surface is slidable on other stainless steel part. The Ag-In alloy has a close-packed hexagonal crystal structure of $\zeta$ phase.

12 Claims, 1 Drawing Sheet

SLIDING PARTS AND PROCESS FOR PRODUCING SAME

BACKGROUND OF THE INVENTION

The present invention relates to sliding parts, for example, for use as threaded parts such as a nut and a screw for providing a screw-fastening type pipe joint which are adapted for screw-thread engagement with each other, a sliding bearing and a shaft thereby supported, two platelike members slidable on each other, etc.

For example, the nut and screw of a screw-fastening type pipe joint are each made of stainless steel for use in the piping for semiconductor production equipment, piping for atomic power plants and piping for chemical plants. When the nut is screwed on the screw to provide the pipe joint, a great load acts on the threaded portions of the two members, so that the joint has the problem that seizure occurs between the threaded portions since no lubricant is usable.

Accordingly, an Ag plating layer is conventionally formed on the surface of threaded portion of the nut to preclude such seizure. Since Ag forms no alloy with Fe, Ag is unlikely to cause seizure when the nut is rotated on the screw, further exhibiting the advantage that the fastening torque is low and stable owing to reduced frictional resistance.

However, Ag is a metal liable to gall. The Ag plating layer wears away to produce a large amount of particles owing to the sliding contact between the threaded portions when the nut is driven on the screw to provide a pipe joint of the screw-fastening type. Further when the connected pipes are separated by removing the pipe joint and then connected together again by the joint, the particles produced are likely to ingress into the piping. When the particles ingressing into the piping are not smaller than 50 $\mu$m in size and adhere to the seat of a valve provided at an intermediate portion of the piping, a leak is likely to occur while the valve is closed even if the seat is made of a resin having a relatively high sealing property. If the seat is made of metal, a leak will occur from the closed valve even when the particles are about 10 $\mu$m in size. Especially the piping for semiconductor production equipment encounters the problem that the particles ingressing into the piping, even if about 0.1 $\mu$m in particle size, adhere to wafers, causing short-circuiting or resulting in altered characteristics.

SUMMARY OF THE INVENTION

An object of the present invention is to overcome the foregoing problems and to provide a sliding part which produces no particles when moved slidingly.

Other objects of the invention will be readily understood as the description proceeds.

The present invention provides a sliding part having a film of an Ag-In alloy formed on a surface of a stainless steel main body thereof and comprising 25 to 35 wt. % of In and the balance Ag and inevitable impurities, the main body surface being slidable on other stainless steel part, the Ag-In alloy having a close-packed hexagonal crystal structure of $\zeta$ phase.

The In content of the Ag-In alloy forming the film stated above is limited to the range of 25 to 35 wt. % because if the content is outside this range, the alloy fails to have the close-packed hexagonal crystal structure of $\zeta$ phase.

The sliding part of the invention has a film formed on the sliding surface thereof and made of an Ag-In alloy which has a close-packed hexagonal crystal structure of $\zeta$ phase, so that when the part is in sliding contact with other stainless steel part, crystals of Ag-In alloy slide for self-lubrication which precludes wear, consequently preventing production of particles. Further the use of the sliding part as the nut or screw of the pipe joint of the screw-fastening type results in a lower fastening torque than in the prior art wherein an Ag plating layer is formed on the surface of the threaded portion, also giving an excellent appearance to the joint since the alloy film is free of oxidation unlike the conventional Ag plating layer.

The present invention provides a first process for producing a sliding part comprising forming a film of an Ag-In alloy comprising 25 to 35 wt. % of In and the balance Ag and inevitable impurities on a surface of a sliding part main body of stainless steel which surface is slidable on other stainless steel part, subsequently holding the main body at 300° to 600° C. for 0.5 to 5 hours and thereafter quenching the main body, whereby the Ag-In alloy is made to have a close-packed hexagonal crystal structure of $\zeta$ phase.

In the first production process described above, the part main body formed with the alloy film is heated at a temperature of 300° to 600° C. because if the main body is heated below 300° C. and thereafter quenched, the Ag-In alloy fails to have a close-packed hexagonal crystal structure of $\zeta$ phase, and further because temperatures above 600° C. sensitize stainless steel, giving rise to intergranular corrosion. Preferably, the upper limit of the heating temperature is as low as possible below the stainless steel sensitizing temperature range, and is not higher than 550° C. The main body having the alloy film formed thereon is heated for 0.5 to 5 hours because when the heating time is less than 0.5 hour, the Ag-In alloy fails to have a close-packed hexagonal crystal structure of $\zeta$ phase even if quenched after heating, and further because if the heating time exceeds 5 hours, a higher cost will result.

The first production process of the invention affords sliding parts having the features stated above.

The present invention provides a second process for producing a sliding part comprising forming an Ag film and an In film alternately on a surface of a sliding part main body of stainless steel which surface is slidable on other stainless steel part, then holding the main body at 140° to 250° C. for 1 to 24 hours to cause Ag and In to diffuse into each other and thereby form a film of an Ag-In alloy comprising 25 to 35 wt. % of In and the balance Ag and inevitable impurities, subsequently holding the main body at 300° to 600° C. for 0.5 to 5 hours and thereafter quenching the main body, whereby the Ag-In alloy is made to have a close-packed hexagonal crystal structure of $\zeta$ phase.

In the second production process described, the main body formed with the Ag film and In film is heated at a temperature of 140° to 250° C. because if the temperature is below 140° C., Ag and In will not diffuse into each other, and further because temperatures above 250° C. are higher than the melting point of In and rupture the In film, failing to give a uniform film thickness. The heating time following the formation of the Ag and In films is 1 to 24 hours because if it is less than 1 hour, the Ag and In will not diffuse into each other, and also because if it is over 24 hours, poor economy will result.

In the second production process, the main body having the Ag-In film formed thereon is heated before quenching at a temperature of 300° to 600° C. for 0.5 to 5 hours for the same reasons as described in the case of the first production process. Similarly, the upper limit of the temperature is preferably not higher than 550° C.

The second production process of the invention affords sliding parts having the foregoing features. The component ratio of the A-In alloy film formed by the diffusion of the two elements into each other is dependent on the thickness ratio of the Ag film to the In film and can therefore be controlled with ease. In the case where the Ag film and In film are individually formed by plating, single-element plating baths are usable which are easy to maintain to attain a cost reduction.

The present invention will be described in greater detail with reference to the accompanying drawing.

DESCRIPTION OF THE PREFERRED EMBODIMENTS

Figure 1:
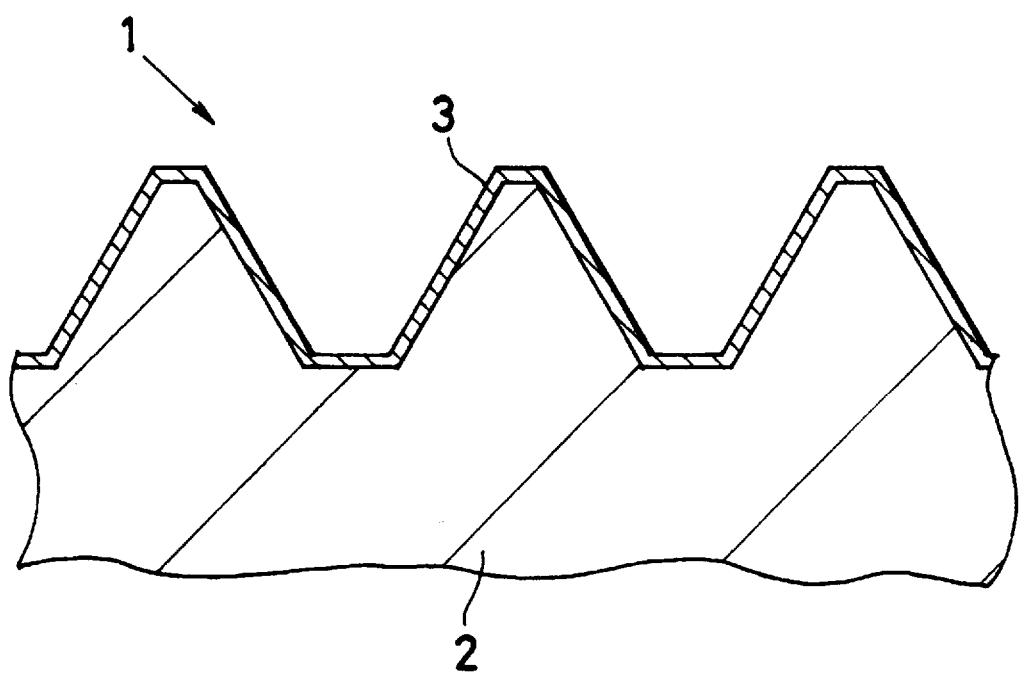
FIG. 1 is an enlarged fragmentary view in vertical section of a nut embodying the invention for use in a pipe joint of the screw-fastening type.

With reference to FIG. 1, a nut 1 for use in a pipe joint of the screw-fastening type has a film 3 of an Ag-In alloy formed on the surface of the threaded portion of a nut main body of stainless steel and comprising 25 to 35 wt. % of In and the balance Ag and inevitable impurities. The Ag-In alloy forming the film 3 has a close-packed hexagonal crystal structure of ζ phase.

The In content of the Ag-In alloy forming the film 3 is limited to the range of 25 to 35 wt. % because if the content is outside this range, the alloy fails to have a close-packed hexagonal crystal structure of ζ phase.

The thickness of the alloy film 3 is preferably within the range of 0.4 to 2.0 μm. If it is less than 0.4 μm, the material of the nut main body 2 itself is likely to come into contact, owing to the surface roughness thereof, with the stainless steel material of the counterpart and to cause seizure, whereas a thickness exceeding 2.0 μm fails to ensure smooth screw-thread engagement, necessitating a special threading operation to entail poor economy.

The nut 1 is produced by a first process which comprises forming a film of an Ag-In alloy comprising 25 to 35 wt. % of In and the balance Ag and inevitable impurities on the surface of threaded portion of a nut main body 2, subsequently holding the main body 2 at 300° to 600° C., preferably at 300° to 550° C., for 0.5 to 5 hours and thereafter quenching the main body, whereby the Ag-In alloy is made to have a close-packed hexagonal crystal structure of ζ phase.

The alloy film is formed, for example, by plating, thermal spraying, vapor deposition or ion plating.

The main body formed with the alloy film is heated at a temperature of 300° to 600° C. for 0.5 to 5 hours for the reasons already given. It is desired that the upper limit of the heating temperature be not higher than 550° C. because if the nut main body 2 is heated at a temperature in excess of 550° C., the temperature is close to the temperature range of sensitizing the stainless steel forming the main body 2, possibly causing intergranular corrosion.

Alternatively, the nut 1 is produced by a second process which comprises forming an Ag film and an In film alternately on the surface of threaded portion of a stainless steel nut main body 2, then holding the main body at 140° to 250° C. for 1 to 24 hours to cause Ag and In to diffuse into each other and thereby form a film of an Ag-In alloy comprising 25 to 35 wt. % of In and the balance Ag and inevitable impurities, subsequently holding the main body at 300° to 600° C. for 0.5 to 5 hours and thereafter quenching the main body, whereby the Ag-In alloy is made to have a close-packed hexagonal crystal structure of ζ phase.

The Ag film and the In film are formed, for example, by plating, thermal spraying, vapor deposition or ion plating. One or at least two Ag films and one or at least two In films are formed alternately in superposed layers. In this case, the two kinds of films are alternately so formed that the Ag film will be positioned as the outermost layer in order to prevent the In film from breaking during heating since In has a low melting point of about 160° C.

Preferably, the thickness ratio of the Ag film to the In film is within the range of 6.5:3.5 to 7.5:2.5. The reason is that if the ratio is smaller than 6.5:3.5 or greater than 7.5:2.5, the resulting alloy fails to exhibit ζ phase even if subsequently held at 300° to 600° C. for 0.5 to 5 hours, followed by quenching. Stated more specifically, the Ag film has a thickness of about 0.3 to about 1.5 μm, and the In film has a thickness of about 0.1 to about 0.7 μm. The thickness ratio of the Ag film to the In film is expressed based on the thickness of each film when these films are each one in number, while if one of the two kinds of films comprises a plurality of layers, the ratio is expressed using the combined thickness of the layers for the kind concerned.

The main body having the Ag and In films formed thereon is heated at 140° to 250° C. for 1 to 24 hours for the reasons already given.

The Ag-In alloy film formed by the diffusion of Ag and In into each other has a thickness which is preferably within the range of 0.4 to 2.0 μm for the same reasons as already given for the Ag-In film formed by the first production process.

The nut main body having the Ag-In alloy film formed thereon is heated at a temperature of 300° to 600° C. for 0.5 to 5 hours for the same reasons as previously given. The upper limit of the heating temperature is preferably not higher than 550° C. for the same reasons as in the case of the first production process.

The foregoing embodiment is a sliding part of the invention for use as a nut for providing a pipe joint of the screw-fastening type, whereas the invention is not limited to such a nut but can be embodied, for example, as the screw of the pipe joint, as a sliding bearing and/or the shaft to be thereby supported or as at least one of two platelike members slidable on each other.

EXAMPLES

Example 1

An Ag-In alloy film having a thickness of 2 μm and comprising 25 to 35 wt. % of In and the balance Ag and inevitable impurities was formed on the surface of threaded portion of a stainless steel nut main body for use in a pipe joint of the screw-fastening type. The main body was then held at 300° C. for 1 hour and thereafter quenched, whereby the Ag-In alloy was made to have a close-packed hexagonal crystal structure of ζ phase. Thus, a nut was prepared for the pipe joint.

Example 2

An Ag film and an In film were alternately formed on the surface of threaded portion of a stainless steel nut main body for use in a pipe joint of the screw-fastening type. The Ag film was 0.5 μm in thickness, and the In film had a thickness of 0.5 μm. The Ag film was formed in two layers, and the In film in a single layer, with the Ag film positioned as the outermost layer. In this case, the thickness ratio of the Ag film to the In film was 2:1. The nut main body was then held at 150° C. for 4 hours to cause Ag and In to diffuse into each other and thereby form an Ag-In alloy film comprising 25 to 35 wt. % of In and the balance Ag and inevitable impurities. Subsequently the nut main body was heated at a slowly rising temperature to 300° C., then held at 300° for 1 hour and thereafter quenched, whereby the Ag-In alloy was made to have a close-packed hexagonal crystal structure of ζ phase. Thus, a nut for the pipe joint was prepared.

Comparative Example

An Ag plating film, 2 μm in thickness, was formed on the surface of threaded portion of a stainless steel nut main body for use in a pipe joint of the screw-fastening type, whereby a nut for the pipe joint was prepared.

Evaluation Test

The nuts of Examples 1 and 2 and Comparative Example were tightened up on and then released from respective stainless steel screws for providing pipe joints of the screw-fastening type, this procedure was repeated ten times, and the nuts were thereafter checked for production of particles. Consequently, the nuts of Examples 1 and 2 released no particles, whereas the nut of Comparative Example produced a large quantity of particles, 50 to 100 μm in size.

What is claimed is:

1. A sliding part having a film of an Ag-In alloy formed on a surface of a stainless steel main body thereof and comprising 25 to 35 wt. % of In and the balance Ag and inevitable impurities, the main body surface being slidable on another stainless steel part, the Ag-In alloy having a close-packed hexagonal crystal structure of ζ phase.

2. A sliding part as defined in claim 1 wherein the stainless steel main body of the sliding part is a nut for a screw-fastening pipe joint and/or a screw therefor.

3. A sliding part as defined in claim 2 wherein the Ag-In alloy film has a thickness within the range of 0.4 to 2.0 μm.

4. A sliding part as defined in claim 1 wherein the stainless steel main body of the sliding part is a sliding bearing and/or a shaft to be supported thereby.

5. A sliding part as defined in claim 1 wherein the stainless steel main body of the sliding part is at least one of two plate members slidable on each other.

6. A process for producing a sliding part comprising forming a film of an Ag-In alloy comprising 25 to 35 wt. % of In and balance Ag and inevitable impurities on a surface of a sliding part main body of stainless steel which surface is slidable on another stainless steel part, subsequently holding the main body at 300° to 600° C. for 0.5 to 5 hours and thereafter quenching the main body, whereby the Ag-In alloy is made to have a close-packed hexagonal crystal structure of ζ phase.

7. A process for producing a sliding part as defined in claim 6 wherein the temperature of heating before the quenching is 300° to 550° C.

8. A process for producing a sliding part comprising forming an Ag film and an In film alternately on a surface of a sliding part main body of stainless steel which surface is slidable on another stainless steel part, then holding the main body at 140° to 250° C. for 1 to 24 hours to cause Ag and In to diffuse into each other and thereby form a film of an Ag-In alloy comprising 25 to 35 wt. % of In and the balance Ag and inevitable impurities, subsequently holding the main body at 300° to 600° C. for 0.5 to 5 hours and thereafter quenching the main body, whereby the Ag-In alloy is made to have a close-packed hexagonal crystal structure of ζ phase.

9. A process for producing a sliding part as defined in claim 8 wherein the thickness ratio of the Ag film to the In film is within the range of 6.5:3.5 to 7.5:2.5.

10. A process for producing a sliding part as defined in claim 8 wherein the Ag film has a thickness of 0.3 to 1.5 μm, and the In film has a thickness of 0.1 to 0.7 μm.

11. A process for producing a sliding part as defined in claim 8 wherein one or at least two Ag films and one or at least two In films are formed alternately in superposed layers, with the Ag film positioned as the outermost layer.

12. A process for producing a sliding part as defined in claim 8 wherein the temperature of heating before the quenching is 300° to 550° C.

* * * * *

UNITED STATES PATENT AND TRADEMARK OFFICE
CERTIFICATE OF CORRRECTION

PATENT NO. : 5,879,819
DATED : March 9, 1999
INVENTOR(S) : Chobee Taguchi, et al.

It is certified that error appears in the above-identified patent and that said Letters Patent is hereby corrected as shown below: On the title page: Item [56]

U. S. PATENT DOCUMENTS

| EXAMINER INITIAL | | PATENT NUMBER | | | | | | | ISSUE DATE | PATENTEE | CLASS | SUBCLASS | FILING DATE IF APPROPRIATE |
|---|---|---|---|---|---|---|---|---|---|---|---|---|---|
| | | 2 | 4 | 6 | 5 | 3 | 2 | 9 | 03/22/49 | Murray | | | |
| | | 2 | 5 | 4 | 7 | 4 | 6 | 5 | 04/03/51 | Heintz el al. | | | |
| | | | | | | | | | | | | | |

FOREIGN PATENT OR PUBLISHED FOREIGN PATENT APPLICATION

| | | DOCUMENT NUMBER | | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|---|
| | FR | 1 | 5 | 3 | 0 | 5 | 5 | 9 | 10/28/68 | France | | | | |
| | DE | 4 | 1 | 0 | 1 | 3 | 8 | 6 | 07/25/91 | Germany | | | | |
| | FR | 1 | 0 | 1 | 8 | 6 | 2 | 6 | 01/12/53 | France | | | | |
| | | | | | | | | | | | | | | |

Signed and Sealed this

Ninth Day of November, 1999

Attest:

Attesting Officer

Q. TODD DICKINSON

Acting Commissioner of Patents and Trademarks